United States Patent [19]

Hofmann et al.

[11] Patent Number: 5,330,853

[45] Date of Patent: Jul. 19, 1994

[54] MULTILAYER TI-AL-N COATING FOR TOOLS

[75] Inventors: Dieter Hofmann, Bruchköbel; Bernd Hensel, Frankfurt, both of Fed. Rep. of Germany

[73] Assignee: Leybold AG, Hanau 1, Fed. Rep. of Germany

[21] Appl. No.: 747,287

[22] Filed: Aug. 19, 1991

[30] Foreign Application Priority Data

Mar. 16, 1991 [DE] Fed. Rep. of Germany ....... 4108712
May 14, 1991 [DE] Fed. Rep. of Germany ....... 4115616

[51] Int. Cl.$^5$ .............................................. B23B 51/00
[52] U.S. Cl. ................................... 428/697; 428/212; 428/336; 428/698; 428/699; 51/295; 51/307; 407/117
[58] Field of Search ............... 428/699, 697, 698, 336, 428/212; 51/295, 307; 407/117

[56] References Cited

U.S. PATENT DOCUMENTS

| | | | |
|---|---|---|---|
| 4,714,660 | 12/1987 | Gates, Jr. | 428/698 |
| 4,753,854 | 6/1988 | Gavrilov et al. | 428/698 |
| 4,842,710 | 6/1989 | Freller | 204/192.38 |
| 4,892,791 | 1/1990 | Watanabe et al. | 428/698 |
| 4,984,940 | 1/1991 | Bryant et al. | 407/119 |

FOREIGN PATENT DOCUMENTS

| | | |
|---|---|---|
| 381268 | 2/1986 | Austria . |
| 0043781 | 6/1981 | European Pat. Off. . |
| 3810237 | 3/1988 | Fed. Rep. of Germany . |
| 3825399 | 7/1988 | Fed. Rep. of Germany . |
| 2224515 | 5/1990 | United Kingdom . |

OTHER PUBLICATIONS

Beerish-Marchwicka et al "Structure of Thin Films Prepared by Cosputtering of Titanium and Aluminum or Titanium and Silicon" Thin Solid Films, 82 (1981) pp. 313-320.

Quinbo et al. "High Temperature Microhardness of Hard Coatings Produced by Physical and Chemical Vapor Deposition" Thin Solid Films, 153 (1987) pp. 19-36.

*Primary Examiner*—A. A. Turner
*Attorney, Agent, or Firm*—Felfe & Lynch

[57] ABSTRACT

Surface coating includes alternating first and second ternary layers, wherein the first layer TiAlN$_x$ has a higher nitrogen content and is considerably thinner than the second layer TiAlN$_y$. The first layer is preferably applied by decreasing the nitrogen content of a reactive atmosphere from a maximum to a minimum during sputtering of a TiAl target. The second layer is then applied by sputtering the TiAl target over a longer period of time while the nitrogen content is maintained constant at the minimum. When a further first layer is applied, the nitrogen is again increased to the maximum.

16 Claims, 12 Drawing Sheets

MULTILAYER TI-AL-N COATING FOR TOOLS

BACKGROUND OF THE INVENTION

The invention relates to a surface coating for end products, which is formed from a mixture of metals wherein Group 1 contains at least titanium, zirconium, hafnium or vanadium, and Group 2 contains at least aluminum or silicon, and this metal mixture is applied to the end product by the vacuum method, especially in a reactive nitrogen atmosphere.

It is already known to use compounds such as TiN, TiC, and $Al_2O_3$ for the coating of cutting and shaping tools to reduce wear (reprint from issue 7,42, volume 1988, Metall Verlag Berlin). Other applications are in diffusion barriers in microelectronics, first-wall coatings in fusion apparatus, or possible use in superconductivity technology. The hard substances are required to have very different properties according to the various technical applications. By far the greatest application at this time is in the reduction of wear in cutting and shaping tools and in decorative coating, wherein the ability of the tools to withstand wear is improved by the coating.

The most frequently studied coating materials are the "binary" nitrides and carbides, TiN and TiC. In a series of tests mixtures of other transition metals are being treated, mainly ZrN and HfN, but also CrN, NbN, and others. Early on, the "ternary" metal mixture $Ti(C_xN_{1-x})$ which has a gradual transition of properties from one to the other hard substance, aroused interest on account of the complete miscibility of the TiC—TiN system.

Heretofore TiAl—$N_x$ coatings have been produced only by processes of physical gas-phase deposition (PVD—physical vapor deposition), mainly by reactive magnetron sputtering in direct-current and HF operation with a single and double cathode arrangement, but also by the reactive arc evaporation process and triode-ion plating. According to the apparatus used and the chosen process conditions, very different coatings were obtained. Particularly influential deposition parameters have proven to be the partial pressure or gas flow for nitrogen (reactive gas) in proportion to the argon (sputtering gas), as well as the negative substrate bias and the plasma density in the vicinity of the substrate by which an ion bombardment of the substrate is achieved during the deposition.

As targets for magnetron sputtering, both mechanically made targets with a drop of aluminum inserted in a titanium target, but preferably TiAl targets made by powder metallurgy, found application.

High-speed steel, tool steels and stainless steels of various types, as well as hard-metal and stellite (cutter inserts) were used as substrate materials. These materials are the common materials for cutting and shaping tools and components.

It is furthermore known from U.S. Pat. No. 4,337,300 (DE 30 30 149 C2) to provide an intermediate layer between the base body and the metal coating in the case of cutter inserts and cutting tools of high-performance high-speed steel or hard-metal. The known intermediate layer consists here of vapor-deposited titanium, and the wear-resistant layer of a titanium-metal mixture from the group, titanium carbide, titanium nitride, titanium carbonitride, titanium oxycarbide and titanium oxycarbonitride deposited from a vapor, the thickness of the intermediate layer not exceeding 0.9 $\mu$m and the wear-resistant layer being 0.5 to 10 $\mu$m thick. The hard layers crumble easily on account of their high internal tension; also, disadvantages are to be expected in the use of the tool due to the "soft" intermediate layer.

U.S. Pat. No. 3,895,156 discloses the application of hard-substance layers such that layers of pure hard substances and layers of metals alternate. It has been found, however, that the hard layers disposed on soft intermediate layers are very sensitive to point stress and tend to break up on account of the flexibility of the soft layer.

Furthermore, the problem still exists that thick layers have high internal tensions, so that in functional parts which are subjected to great stress in their use the coatings are easily broken off or spall, and the functional parts are no longer usable after a short period of time.

In the production of hard-substance layers of metals of Group IVa of the Periodic Table including Ti, it is also taught by European Patent 0,121,625 B1, to which U.S. Pat. No. 4,428,812 corresponds, to operate with a pulsating feed of nitrogen order to avoid the reduction of the rate of deposition which otherwise occurs in the continuous feeding of reactive gas. The alteration of the gas feed in this known process takes place with such great frequency that it leads to no recognizable change in the layer structure, and instead only homogeneous layers are thereby formed.

In all of the layers known heretofore having a very hard surface an additional problem has been that these layers have a relatively high coefficient of friction, which likewise led to high layer stresses.

SUMMARY OF THE INVENTION

Accordingly, the objective of the invention consists in improving the useful life of tools by covering the functional parts with a thick coating of the hard substance, especially with a layer of TiAl—$N_x$, which will have a low inherent tension with a low coefficient of friction.

The objective is achieved by forming the surface layer of a plurality of individual layers, wherein the ratio of the metal mixtures, especially that of the layer consisting of a TiAl—$N_x$-metal mixture, to an adjacent layer consisting of a metal mixture, especially of a TiAl—$N_y$-metal mixture, varies.

In the coating of functional parts, of steels for example, especially of HSS (heavy duty high speed steel), the deposition is begun with a TiAl—$N_x$ layer with a first high nitrogen content. Then the nitrogen percentage is lowered according to a gradient or shape, and finally a second layer having a composition in elemental proportions of approximately $Ti_{0.34}Al_{0.37}N_{0.29}$ is established. The gradient is a function of the gas feed, i.e., by the gas feed according to the slope section a special structure is formed in the coating, in which the nitrogen content is great. The extent of the slope relates to first layer thicknesses of about 0.05 to 0.15 $\mu$m. By the application of a slope, a nitrogen feed increased up to 100% is used in comparison to the nitrogen feed used for the second layer, whereby, comparison to the thick layer, a coating is built up with an increased nitrogen content and a composition of approximately $Ti_{0.32}Al_{0.36}N_{0.32}$. Then this layer is covered with a layer of constant composition $Ti_{0.34}Al_{0.37}N_{0.29}$, with a thickness between 0.5 and 1.5 $\mu$m. This alternation of a nitrogen-rich slope and $Ti_{0.34}Al_{0.34}N_{0.29}$ is repeated until the necessary total coating thickness is reached. By the present method a build-up of a multilayer hard-substance has been achieved, and critical loads of up to 90N have been measured by means of the scratch test on hardened HSS steel. Adherence, measured with the critical load as the index of coating adherence for coatings with thicknesses ranging from 4 to 12 μm, proved to be virtually independent of coating thickness. This signifies that the loading (bias) of the interface by the internal tension of the coating of the hard substance (pressure tensions which are increased as the coating thickness increases) is lowered by the use of the multilayer build-up and therefore is very uncritical.

In the use of the tool, surface temperatures of up to 600° C. occur briefly in the layers. Under these conditions oxidation processes can occur which impair the useful value of the coatings. The coating material TiAl—$N_x$ has the advantage that a covering layer containing aluminum oxide is formed at the surface of the coating due to the aluminum present in the layer. This substantially improves the thermal stability of the layer and the properties of the working surface of the tool with respect to the material being machined, in comparison to hard-substance coatings such as TiN, TiC and TiCN.

The extreme hardness of the hard substance, when in the form of TiAl—$N_x$ layers with thin, nitrogen-rich layers lying between them, shows, when used on the tool, only a slight tendency to pick up on the cutting edge, plus a low coefficient of friction. These are outstanding properties for the industrial use of this layer system. In some cases the PVD layers can far exceed the qualities required for the application, in comparison to the bulk material (which is usually stoichiometric).

For the operation of the layer system consisting of TiAl—$N_x$ it is advantageous that the individual layers have a different thickness, and that the thick second layer consisting of hard substance be adjoined in each case by a thin layer also consisting of hard substance, the thin first layers having a higher nitrogen content with respect to the metal (Ti) forming the nitride than the thick layers.

It is furthermore advantageous for the layers with a high nitrogen content to have each a thickness between 0.05 and 0.15 μm, and for the nitrogen feed during the coating build-up to vary between two limit values, the ratio Ti:N being varied by a 50% decrease in the feed of nitrogen during the coating.

In one embodiment the ratio of the atoms of Ti:N of at least one second layer is within the range of 1.3 to 1.1, especially 1.2, and the Ti:N ratio of the adjoining first layer is within the range of 1.1 to 0.9, especially 1.0.

In another embodiment the ratio of atoms Ti:N in at least one second layer is 1.15 to 1.2, and the ratio of atoms Ti:N in at least one first layer is 0.95 to 1.0.

It is furthermore advantageous that the ratio of the atoms Al:Ti of at least one layer and/or of the target be between 1:0.8 and 1.1.

According to a further development of the method of the invention the variation of the nitrogen feed is subjected to a change over time, wherein the nitrogen content of the first layer goes from a maximum to a minimum, and at the same time a plasma discharge is sustained close to the substrate surface, while the substrate is kept in the temperature range between 350° C. and 600° C.

It is especially important for the present invention that the cycle ratio between the periods of high nitrogen feed and the periods of low nitrogen feed be selected between 1:5 and 1:10. For the formation of a of first layer of about 0.1 μm, a period of one minute is needed, and for a second layer thickness of about 0.9 μm a period of 9 minutes.

In connection with the process for the product of a surface coating it is advantageous if, after the building up of a second layer with a low nitrogen content, the gas flow increases abruptly to the maximum and then is reduced gradually during formation of the first layer, continuously or step-wise, back to the level of the gas flow for the second layer.

Furthermore, it is advantageous that the target starting material consist of a TiAl alloy containing between 25 and 60 at % Al, but especially between 30 at % and 55 at % Al, preferably 50 at % Al.

In the preparation of the coating according to the invention, a three-substance system is involved. Aluminum has a relatively small atomic radius so that, setting out from TiN, the insertion of Al instead of Ti into the lattice changes the lattice constant and produces a corresponding internal tension. This change can be controlled through the aluminum content. Normally, the aluminum content raises the internal tension of the layer material and reduces the lattice constant. The relieving of the tensions in the layer is brought about by the application of the above-described layer system with a change in the conditions of growth by the deposit of intermediate layers with a higher feed of nitrogen. Through the use of the thick second layer with the lower nitrogen content it is possible to achieve on the coated section a lower friction resistance to a chip sliding across it or to a corresponding workpiece. It is thus recommendable to use the low-nitrogen second layer as the outer or cover layer.

It is advantageous, furthermore, for the material or workpiece that is to be coated to be covered first with a thinner first layer, so that in the transition between the rest of the total coating and the material to be coated a so-called bonding layer will be present.

The nitrogen put into the gas atmosphere becomes activated (reactive) in the plasma and bonds to the material sputtered from the cathode onto the surface of the substrate, so that a surface layer develops on the tool, which is formed of the target material consisting originally of TiAl and the corresponding admixture of nitrogen. By the admixture of nitrogen a material of high resistance to wear and to oxidation is achieved.

It is furthermore advantageous for the end product or workpiece that is to be coated, to be coated first with the thinner first layer, and for carbon to be added to the upper and/or final layers with a carbon content that increases toward the surface. In this manner a less oxidation-resistant layer is obtained only at the surface. This has to do, however, with the use of only the most heavily stressed functional surfaces. This gives a coating of this kind a friction-reducing component. The carbon content can amount to 50 at % with respect to the titanium.

It is also advantageous for at least one of the layers to have an alloying component of 35 at % Ti, 35 at % Al and 30 at % N.

An additional possibility is to have a cover layer of a material having one of the composition.

DETAILED DESCRIPTION OF THE PREFERRED EMBODIMENTS

Figure 1:
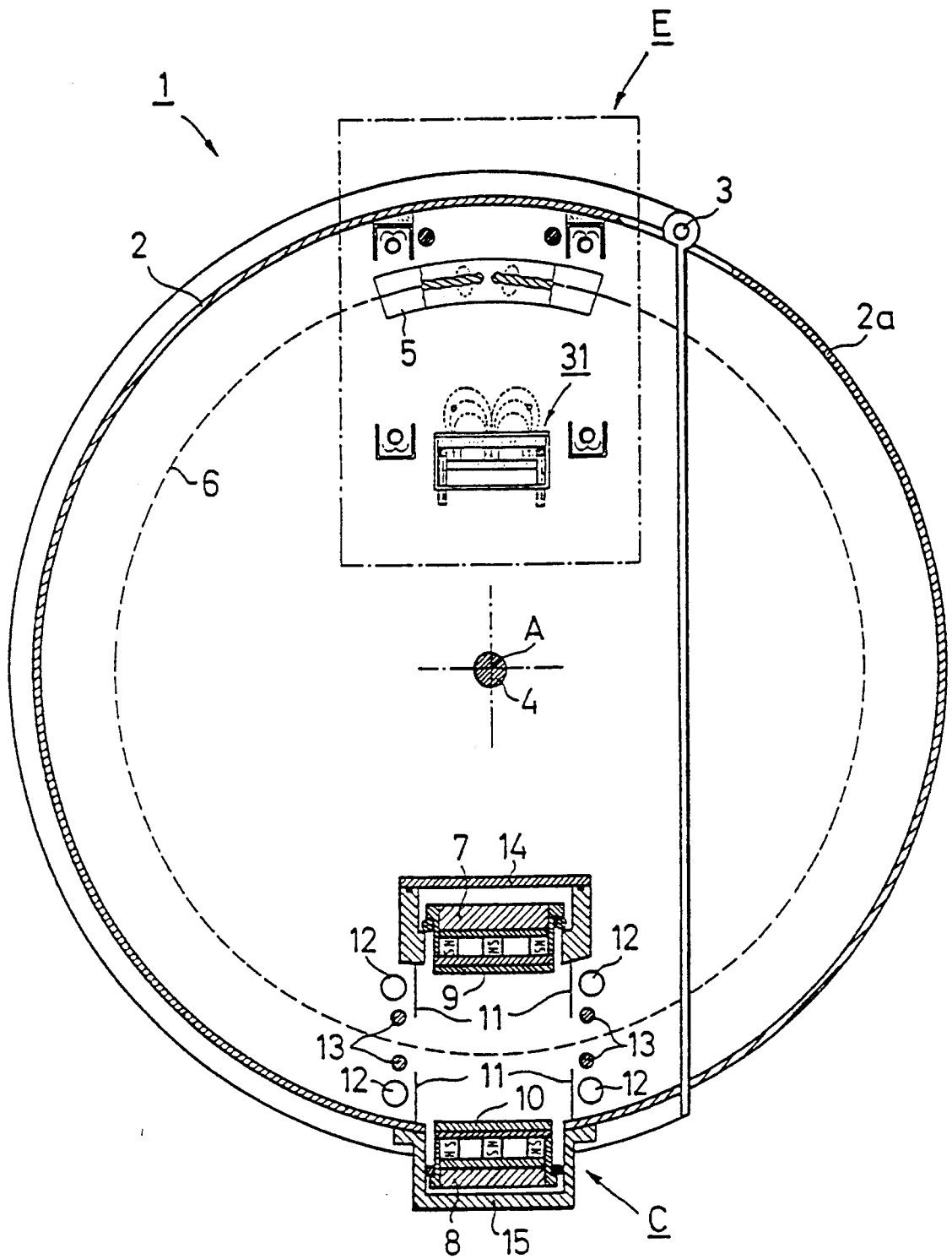
FIG. 1 is a horizontal section through a vacuum apparatus with a vertical chamber axis and two stations for the alternating etching and coating of substrates (the part that is important to the invention is within the dash-dotted rectangle).

In Figure 1 there is represented a vacuum chamber 1 which has a cylindrical chamber wall 2 with a vertical axis. Part of this chamber wall is separated segmentwise and forms a door 2a which is connected to the vacuum chamber by a hinge 3.

Figure 8:
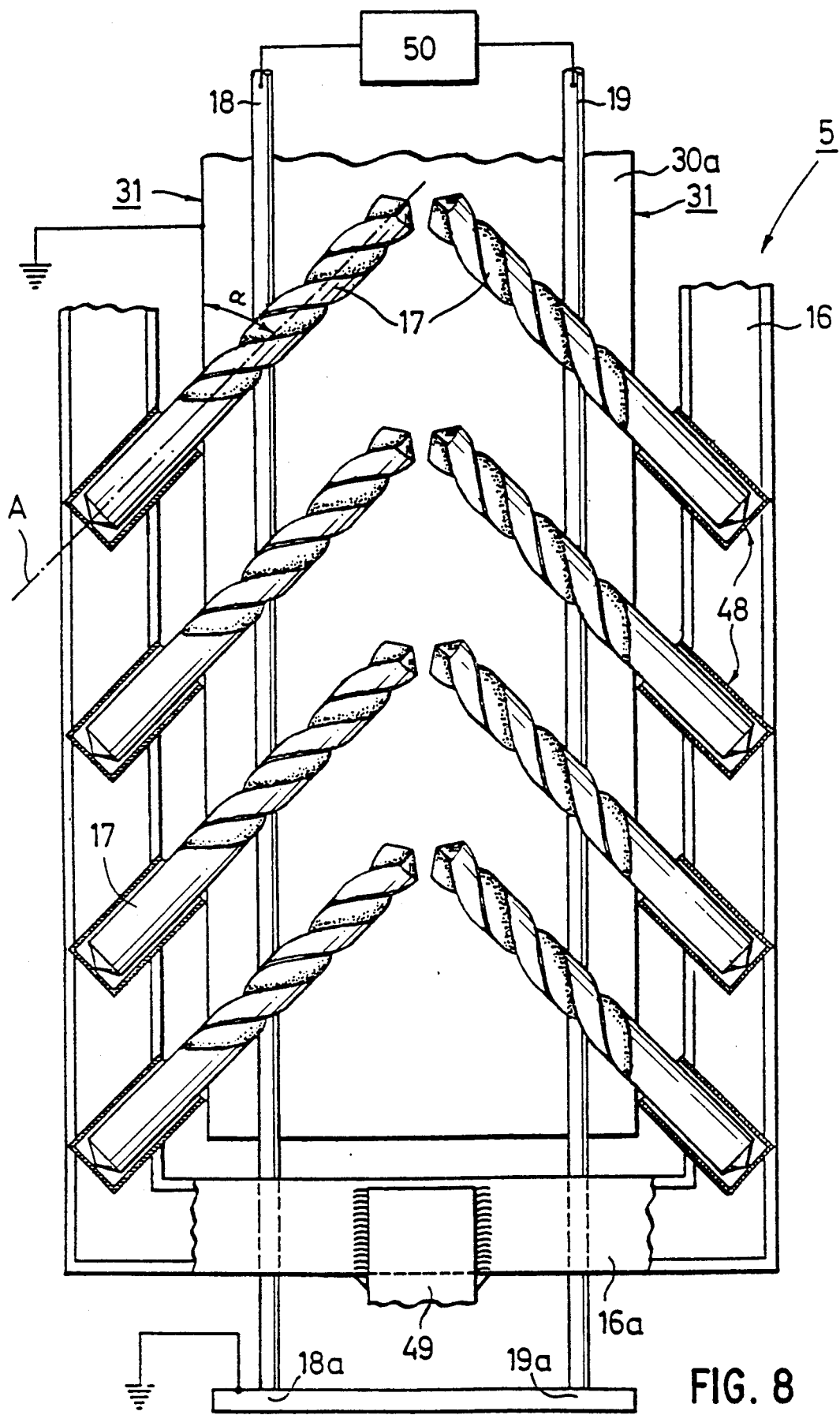
FIG. 8 is a side view of a rotatably disposed substrate holder containing substrates (drills).

The vacuum chamber includes a driving means, not shown, with a coaxial shaft 4 by which a substrate holder 5, which is better represented in FIG. 8, can be carried on a circular path 6 for the movement of the substrate holder. The shaft 4 is mounted in an insulated manner, not shown, and provided with a power connection to apply to the substrate holder an etching potential negative with respect to ground.

In reach of the path of movement 6 and in substantially mirror-image symmetry with the latter a coating station C is disposed, which in itself is state of the art and therefore will be explained but briefly. The coating station C has two magnetron cathodes 7 and 8 of known construction, with targets 9 and 10 made of the coating material. If, as in the present case, the deposited layers contain a chemical compound of the metal mixture, of TiAl—$N_x$, then the targets 9 and 10 consist of TiAl, and they are sputtered in a reactive atmosphere in the presence of nitrogen.

Figure 9:
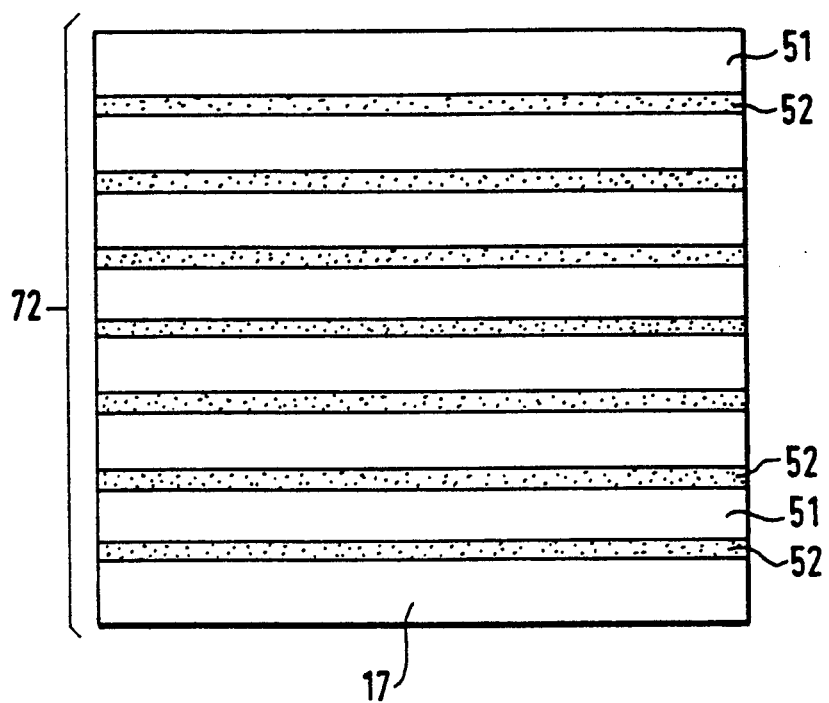
FIG. 9 shows a multilayer coating in which the second layer of TiAl—$N_x$ has a lower nitrogen content than the first layer beneath it.

The surface coating 72 in FIG. 9 can be formed of different metal mixtures; at least titanium, zirconium, hafnium vanadium, and a second group which contains at least aluminum or silicon. Such a metal mixture is applied to the end product by the vacuum process, especially in a reactive nitrogen atmosphere. Tools for the shaping or cutting technology, or temperature-resistant components of machinery or apparatus, jewelry and products for everyday use, can advantageously be provided with a multilayer coating 72.

The reaction space situated between the targets is protected by baffles 11 all around the circumference except for a gap for the passage of the substrate holder 5. Gas distributing tubes 12 serve for the delivery of the reaction gas. The system is completed by anodes 13 into which electrons originating from the discharge enter.

The magnetron cathode 7 is inserted into a cathode housing 14 with the interposition of an insulator, not shown, which simultaneously produces the seal. The cathode housing 14 surrounds the magnetron cathode also at the sides except for a gap whose width is narrower than the dark space separation existing under the conditions of operation. Similarly, the magnetron cathode 8 is contained in a cathode housing 15 which is inserted hermetically into the chamber wall 2. It is to be understood that several such coating stations C can be disposed on the circumference of the path of movement 6.

On the side opposite the coating station C (cf. FIG. 1) there is the etching station E, surrounded by dash-dotted lines, the details of which will be further explained in connection with FIG. 2 with the aid of FIG. 8.

Figure 2:
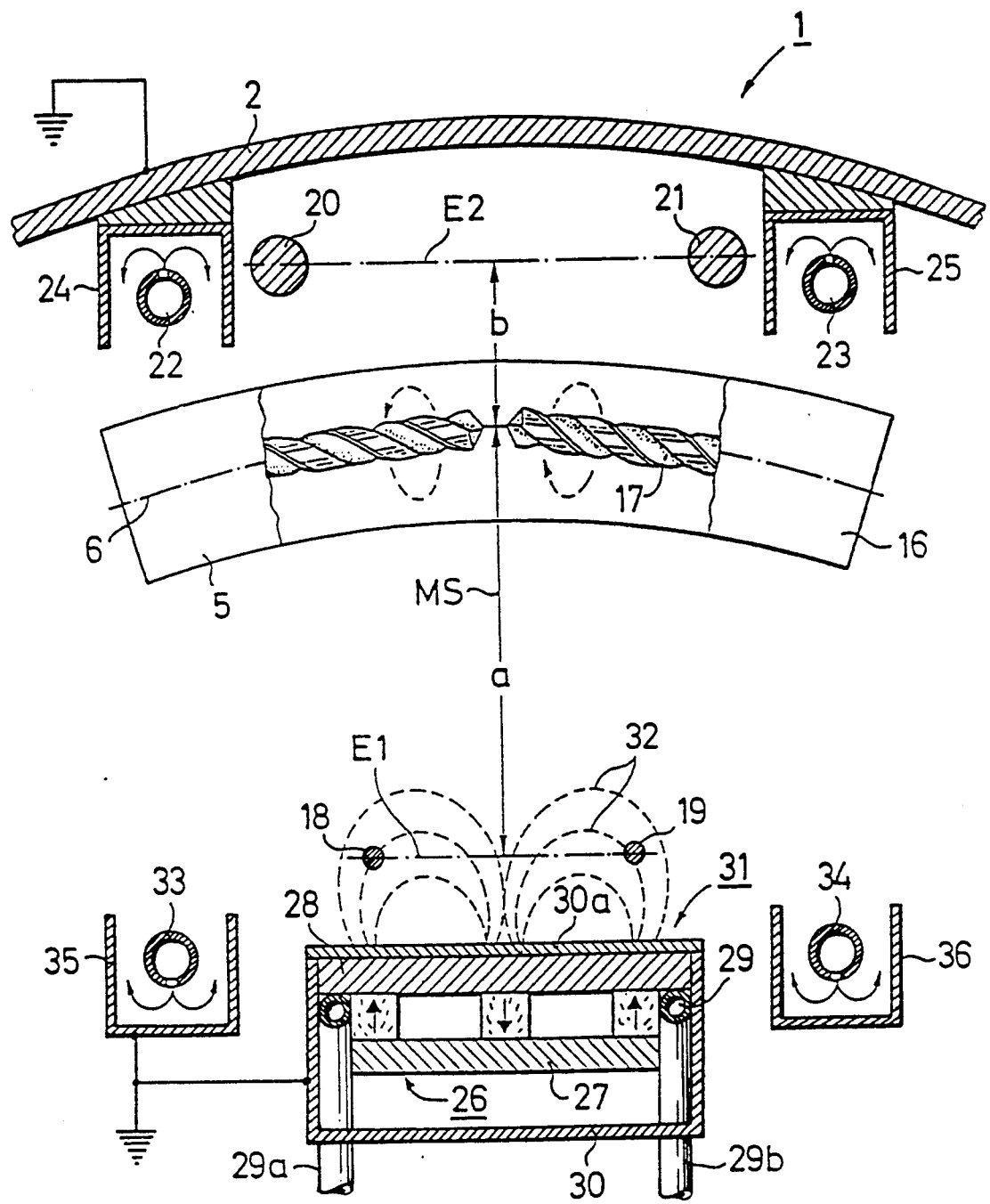
FIG. 2 is an enlarged view of the section within the dash-dotted rectangle in FIG. 1.

In accordance with FIG. 2, the substrate holder 5 moves along its path 6 or positions the substrates to be treated in front of the appropriate work station, where a stationary treatment can then be performed. The substrate holder 5 has one or more frames 16 into which, as shown in FIG. 8, several substrates 17 are inserted. In the example depicted, these are drills which are held in a herringbone-like arrangement in the frame 16, the axes of the drills being approximately tangential to a cylindrical surface in which the path of movement 6 lies. Thus the slightly curved geometry of the bottom and top side of the frame 16 is sufficiently defined.

For reasons of uniformity, the treatment of the drills is performed preferably with a subrotation of the drills.

On the one side of the path of movement 6 of the substrate holder 5, two electron emitters 18 and 19 are disposed toward the axis A of the vacuum chamber 1, while on the opposite side of the path of movement 6 two anodes 20 and 21 are disposed. The arrangement is made as follows: If two planes E1 an E2 parallel to one another and represented in the drawing as dash-dotted lines, are drawn through the axes of the electron emitters on the one hand and those of the anodes on the other, and if the common central vertical line MS, which anyway is radial to the axis A (FIG. 1), is drawn to both lines, this central vertical line MS is divided by the path of movement 6 into a longer line and a shorter line. The longer line corresponds to the distance a of the electron emitters from the path of movement and is greater at least by a factor of 1.5 than the other line which corresponds to the distance b of the anodes from the path of movement. The entire arrangement according to FIG. 2 is constructed in mirror-image symmetry to the central vertical line MS.

The anodes 20 and 21 are configured as cylindrical rods whose axes are 95 mm apart and about 20 mm from the chamber wall 2. The length of the anodes 20 and 21 corresponds at least to the height of the substrate holder 5 shown in FIG. 8. The ends of the anodes 20 an 21 are fastened in the vacuum chamber 1 with insulation, and are connected to a voltage source.

The pair of anodes 20-21 is disposed between gas distributing tubes 22 and 23 whose numerous gas orifices are aimed at the chamber wall 2. Each gas distributing tube is surrounded by a U-shaped baffle 24 and 25, respectively, so that the gas or gas mixture will be steered toward the path of movement 6 or substrate holder 25.

The gas distributing tubes 12, 22, 23, 33 and 34, especially their orifices for the delivery of the reaction gas, are, in an advantageous manner, disposed in the nearest possible vicinity of the targets 9 and 10, so that, when the gas flow rate in the target area changes, it will be possible to produce an immediate effect on the partial pressure of the system and to exercise a positive influence on the varying build-up of the layers.

On the side of the electron emitters 18 and 19 facing away from the path 6 there is a magnet system 26 consisting of several permanent magnets and a ferromagnetic yoke plate 27. The permanent magnets are not numbered, but their opposed polarity is indicated by arrows. The free pole faces of the permanent magnets abut against a plate 28 consisting of copper, onto which a coolant line 29 with connections 29a and 29b is soldered. The entire magnet system 26 is surrounded by a housing 30 consisting of high-grade steel and forms a so-called secondary electrode 31 which is at ground potential.

The magnet system 26 forms in plan (in the radial direction) along the vertical center line MS an arrangement of magnets of opposite polarity one inside the other, which produce a magnetic tunnel in the form of an oval or racetrack (path of movement 6) that is closed on the circumference. This magnetic tunnel is indicated by the curved broken lines which run out from the surface of the secondary electrode and return to it. The electron emitters 18 and 19 have a very specific location in this magnetic field 32, which is defined by the value of the field strength in the meaning of the teaching of the invention. In any case, the field strength is decidedly lower in the area of the substrates 17.

The secondary electrode 31 is also flamed in on both sides by gas distribution tubes 33 and 34, which in turn are again surrounded by U-shaped baffles 35 and 36, the arrangement being made in this case too so that the gas or gas mixture issues from the gas distribution tubes 33 and 34 first rearwardly (with respect to the electron emitters 18 and 19), but then is turned by the baffles 35 and 36 toward the path of movement 6.

An important part of the secondary electrode 31 is the front plate 30a of the housing 30 facing the electron emitters 18 and 19. This front plate 30a is in any case disposed between the magnet system 26 and the electron emitters 18 and 19. The center of the vacuum chamber 1 is formed by the shaft 4 which in FIG. 1 is located behind the secondary electrode 31.

Figure 3:
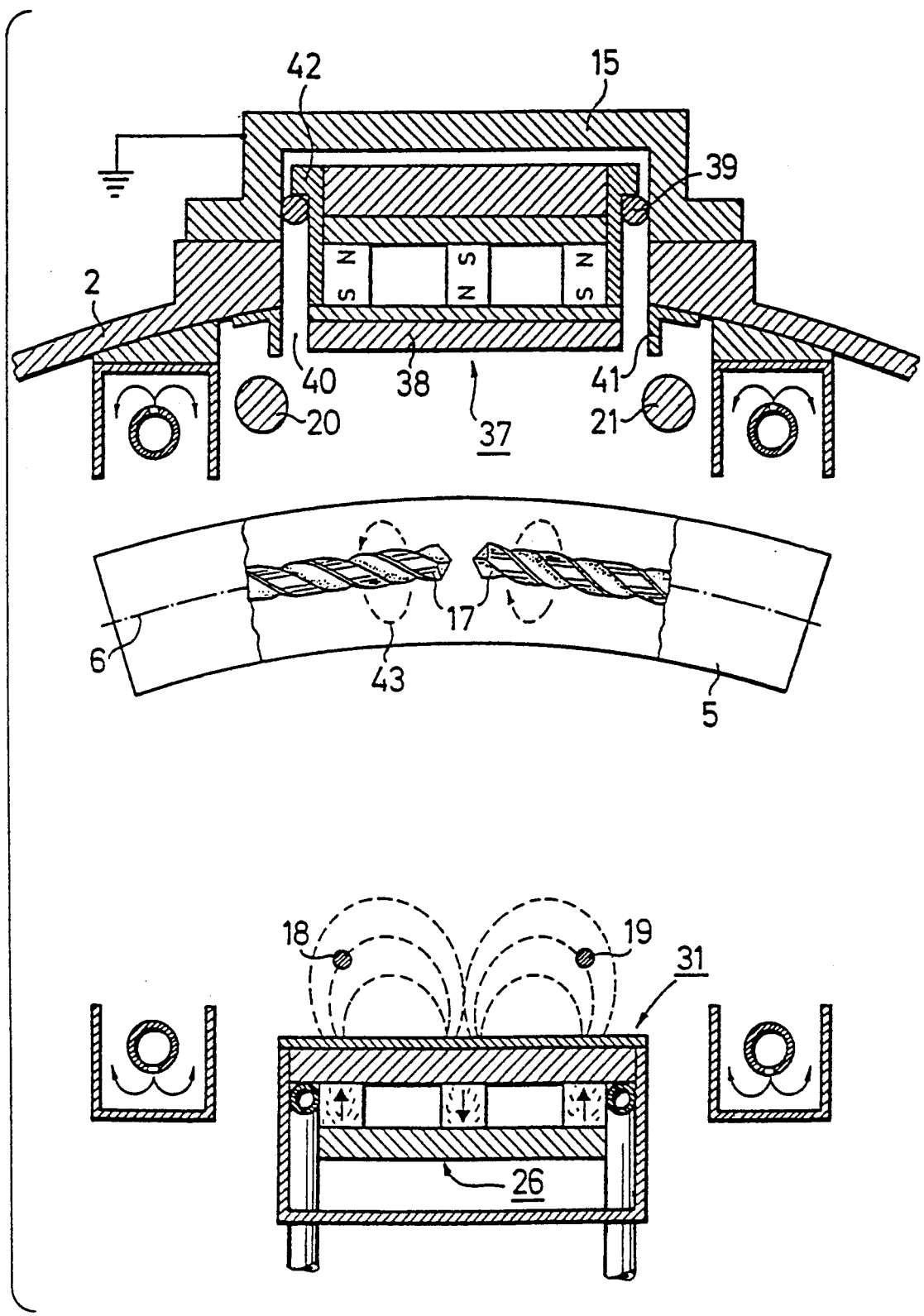
FIG. 3 shows another configuration of the subject matter of FIG. 2 with the addition of a magnetron sputtering cathode in the wall of the vacuum chamber.

In the embodiment according to FIG. 3, a magnetron cathode 37 with a target 38 consisting of coating material is situated on the side of the anodes 20 and 21 in the wall 2 of the vacuum chamber. It is a magnetron that is quite similar to the one shown at the bottom in FIG. 1.

The magnetron cathode 37 is held in the cathode housing 15 (cf. FIG. 1) by an insulator 39 which is also a gasket, leaving an air gap 40 whose width is less than the "dark space distance" that establishes itself under the usual operating conditions. For the lateral definition of the target 38, angular grounded shields 41 are disposed at equal distances apart on the chamber wall 2. This assures that no glow discharge will form on the periphery of the cathode base body 42 and target 38.

The magnetron cathode 37 in FIG. 3 serves for coating the substrates 17 after completion of the etching process. While the substrates 17 (drills) do not have to be rotated during the etching process, a rotation of the substrates in the sense of the broken arrows 43 must take place during the coating process on account of the unilaterally acting magnetron cathode 37.

Figure 4:
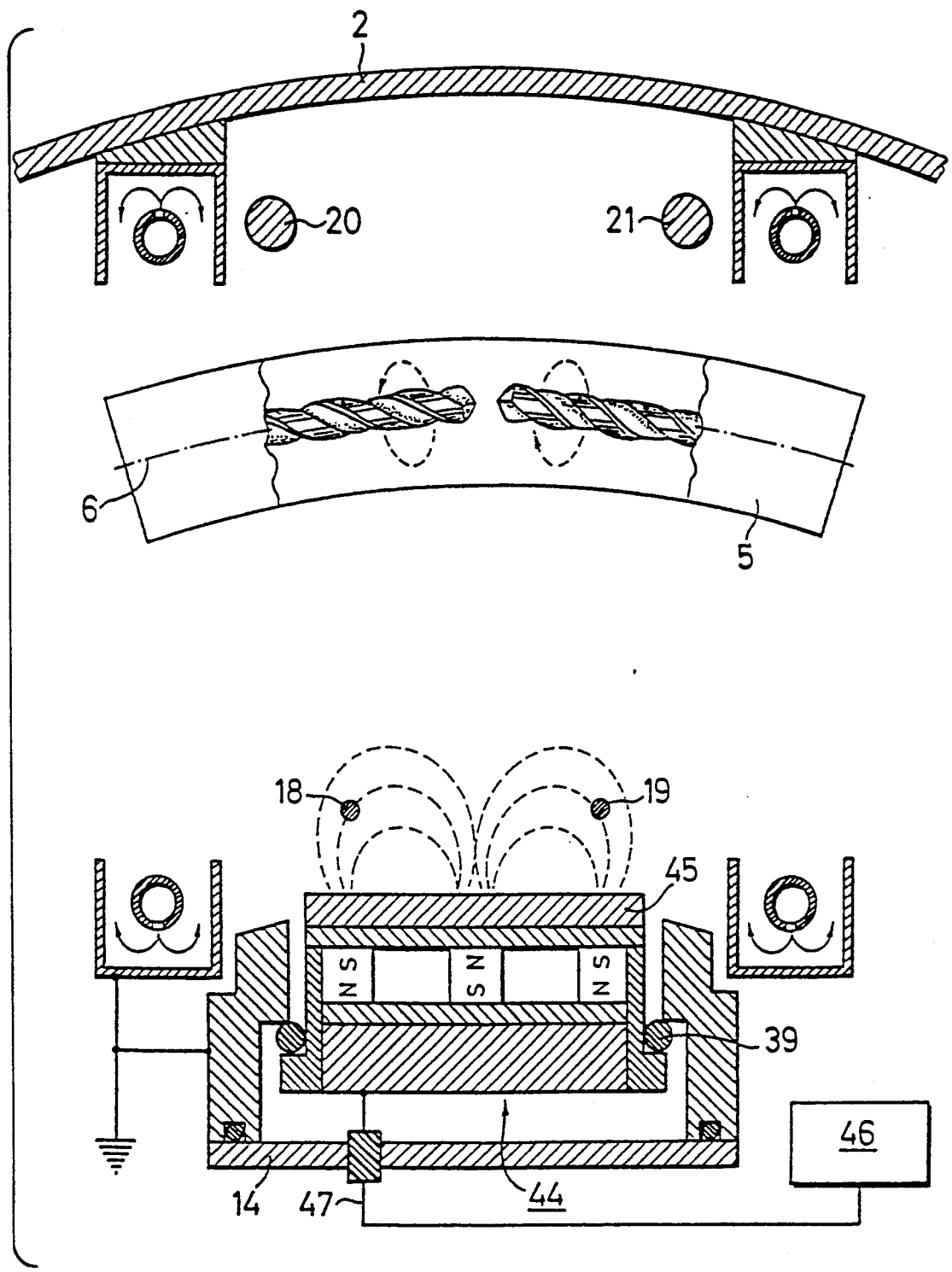
FIG. 4 shows a variant of the subject of FIG. 2, in which the secondary electrode with magnet system has been replaced by a magnetron cathode with a target.

In the embodiment according to FIG. 4, the upper part is the same as in FIG. 2. The secondary electrode 31 with the magnet system 26, however, is replaced by a magnetron cathode 44, which is on the side of the electron emitters 18 and 19 remote from the path of movement 6. This magnetron cathode 44 also bears a target 45 consisting of coating material. The magnetron cathode 44 is likewise held in the cathode housing 14 by an insulator 39 and connected by an electrical conductor 47 to a variable voltage source 46. This kind of arrangement can be switched from etching to coating. The etching process is performed at a negative cathode potential of 100 to 250 V. Negative potentials of 300 to 1000 volts are used as the substrate potential. During the etching phase the target 45 forms the secondary electrode to a certain extent. By setting a negative cathode potential of about 400 to 700 V, resulting in an increase of the power density from $<1$ Watt/cm$^2$ to about 8 to 15 Watts/cm$^2$ (with respect to the target surface), the etching process can be changed over to a coating process. The substrate potential is typically selected within the range of $-10$ volts to $-100$ volts for the coating process.

Figure 5:
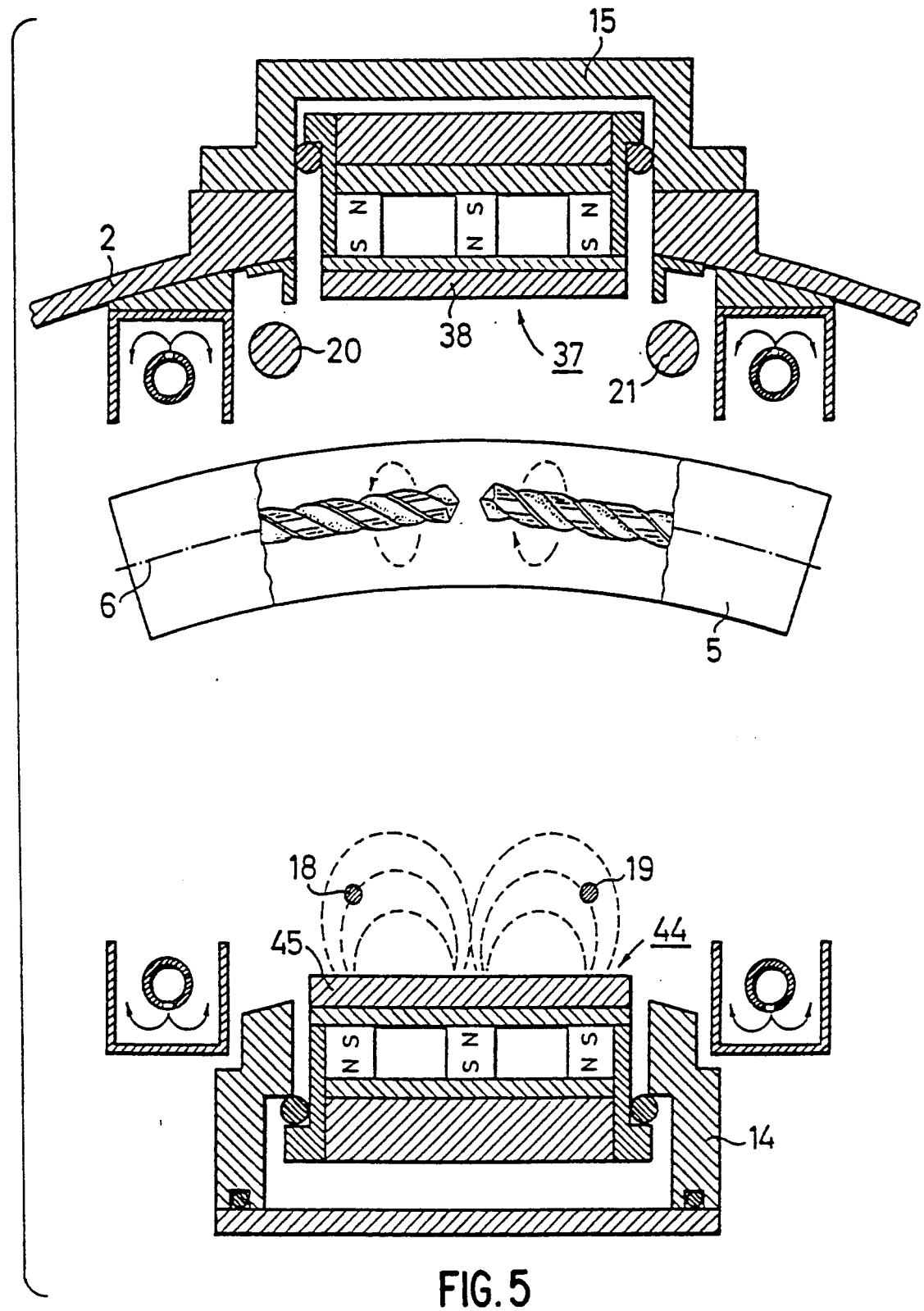
FIG. 5 shows an expansion of the subject of FIG. 4 by the addition of another magnetron cathode which has been supplemented as in FIG. 3.

In the case of the embodiment according to FIG. 5, magnetron cathodes 37 (in accordance with FIG. 3) and 44 are disposed in an opposing arrangement on both sides of the path of movement 6, and are provided with targets 38 and 45, respectively. At least one of the magnetron cathodes is connected, in a manner similar to that of FIG. 4, to a variable voltage source whose output voltage can be switched from etching to coating operation. The two electron emitters 18 an 19 are associated here, in a manner similar to that of FIG. 4, with the magnetron cathode 44, while the anodes 20 and 21 are associated with magnetron cathode 37. The geometrical position of the electron emitters 18 and 19 and of the anodes 20 and 21 with respect to the path of movement 6 is otherwise the same as in FIG. 2, especially with regard to the spacing ratio a:b.

Figure 6:
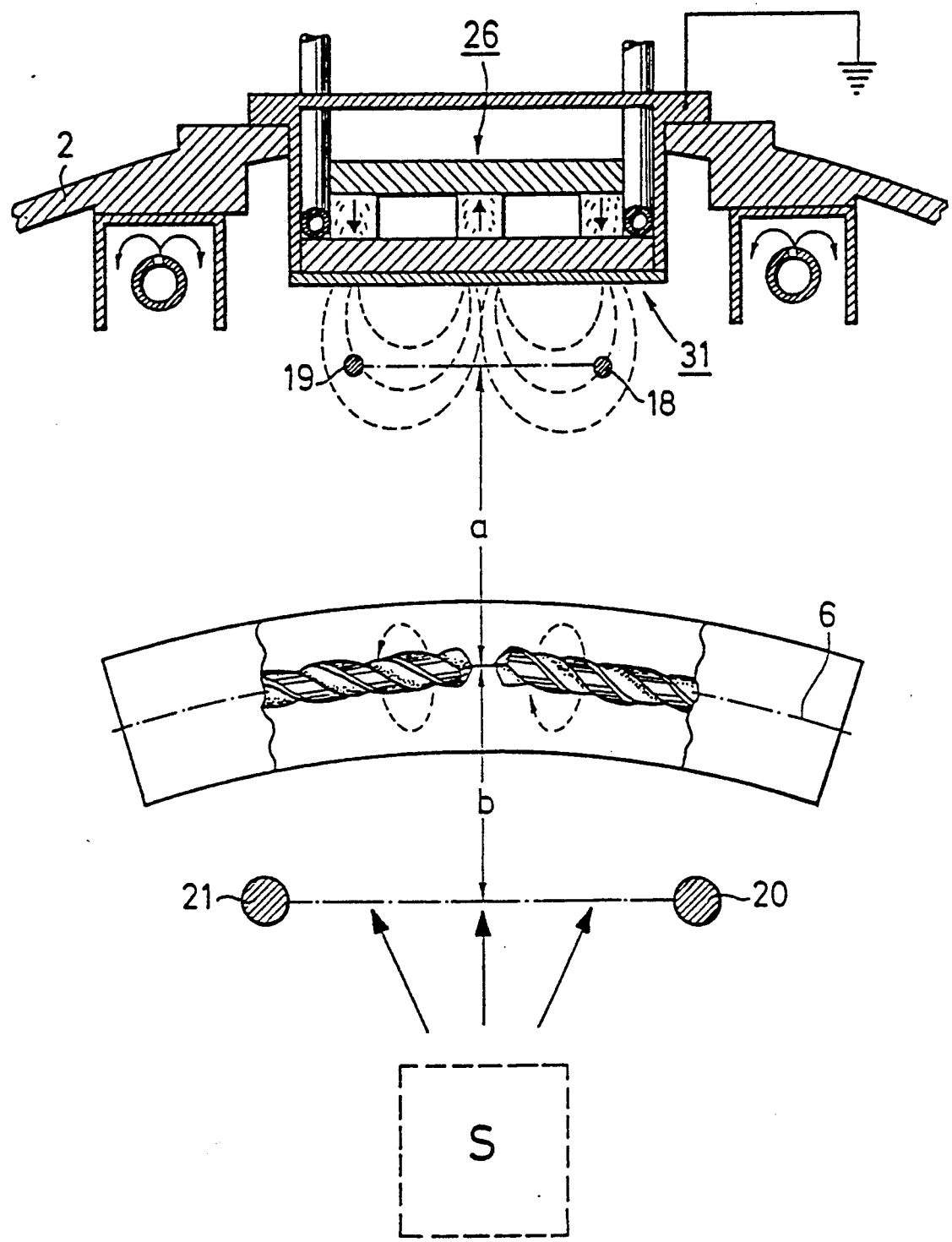
FIG. 6 shows a geometrical reversal of the principle of construction of FIG. 3, in which the secondary electrode with magnet system and electron emitters has been inserted into the wall of the vacuum chamber, while the source S of the coating material has been shifted into the interior of the chamber.

In the case of the embodiment in FIG. 6, the geometrical arrangement is essentially the reverse of that of FIG. 3, i.e., the otherwise entirely identical secondary electrode 31 with the magnet system 26 is now inserted into the chamber wall 2. The electron emitters 18 and 19 are placed in front of it the same as in FIG. 3. On the side of the path of movement opposite the electron emitters 18 and 19, the two anodes 20 and 21 are now arranged toward the center of the vacuum chamber. The coating source "S" disposed behind them is represented only very generally, and can be a vacuum evaporator or other source of PVD material.

Figure 7:
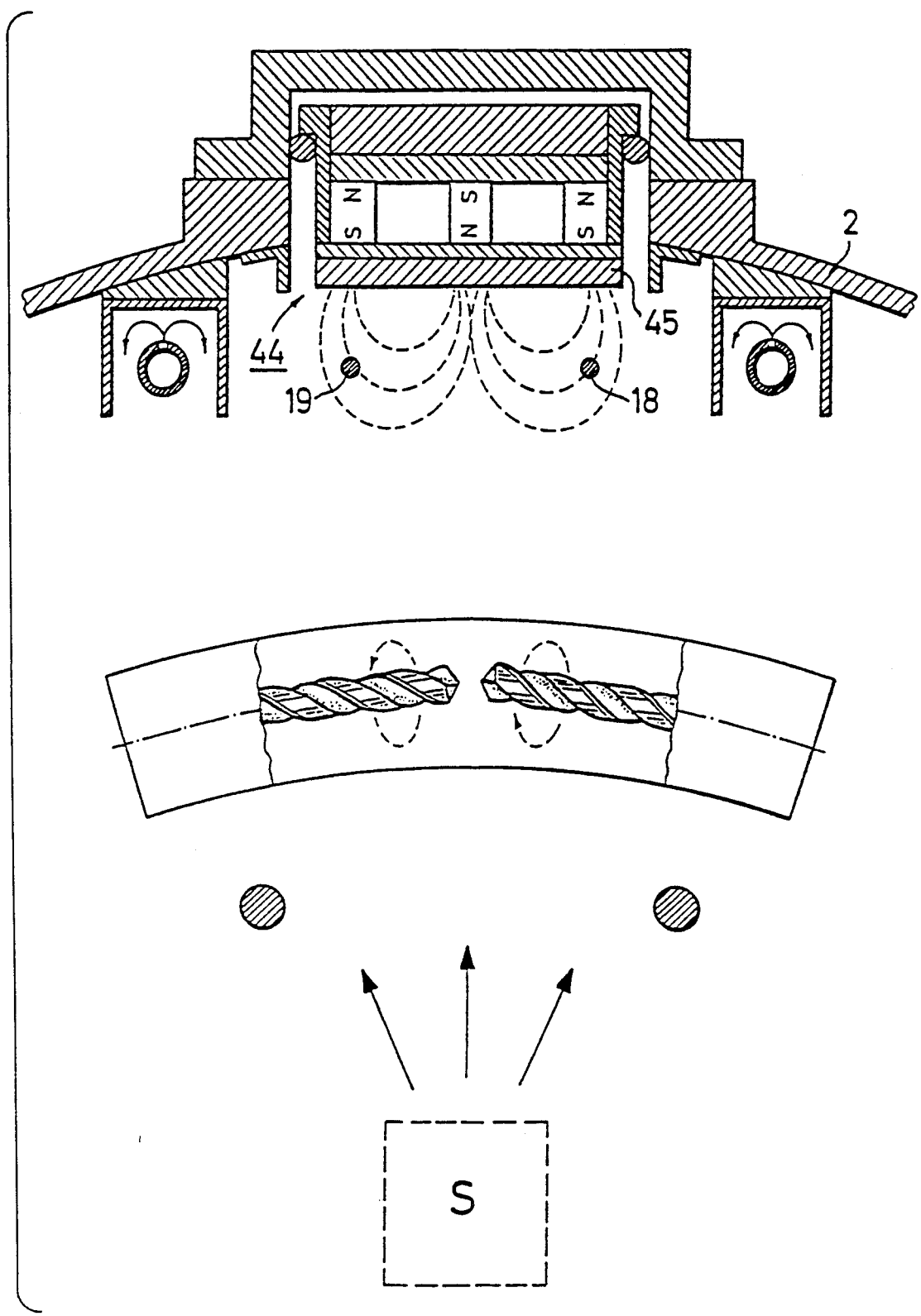
FIG. 7 is a variant of the subject of FIG. 6, in which the secondary electrode has been replaced by a magnetron cathode with a target.

In the embodiment in FIG. 7 the electron emitters 18 and 19 are likewise disposed on the side of the path 6 adjacent the chamber wall 2. A magnetron cathode 44, which is the same as the one in FIG. 4 (bottom) and is provided with a target 15, is situated on the chamber wall 2 behind the electron emitters 18 and 19, as seen from the path 6. This magnetron cathode is also connected, in a manner not shown, to a variable voltage source 46 like the one shown in FIG. 4 (bottom). By the appropriate variation of the output voltage of the voltage source 46 the apparatus can be switched from "etching operation" to "coating operation." In that case a corresponding variation of the substrate potential is also to be performed.

FIG. 8 shows the bottom part of the frame 16 of the substrate holder 5 with several sockets 48 whose axes are arranged at an angle α to the vertical. In the present case the substrates 17 are twist drills which are in a herringbone arrangement on account of the angle of the sockets 48. The bottom 16a of the frame is provided with a shank 49 which is releasably inserted into a holder fastened to the shaft 4 (FIG. 1). FIG. 8 also shows the outline of the secondary electrode 31 or front plate 30a and the two electron emitters 18 and 19 which extend vertically in the form of elongated wires in front of the front plate 30a and parallel thereto. The bottom ends 18a and 19a of the electron emitters are connected to ground, while the two upper ends are connected to a voltage source 50, so that the two electron emitters can be heated to temperatures at which an appreciable electron emission takes place.

All of the targets, magnetron cathodes, secondary electrodes etc. have a rectangular outline whose longest axis is vertical. The geometrically similar frame 16 of the substrate holder also has a vertically oriented longest axis. Even the electron emitters 18 and 19 and anodes 20 and 21 are of such a length that they extend through the entire etching system.

EXAMPLE

In a vacuum etching and coating apparatus Model Z 700 of Leybold Aktiengesellschaft of Hanau, Federal Republic of Germany, which was especially equipped in accordance with FIGS. 1, 2 and 8, twist drills of a diameter of 8 mm were first etched and then hard-coated with $TiAl-N_x$.

The drills 17 were degreased with dichloromethane and cleaned in alkaline solutions, and finally dried in fluorochlorinated hydrocarbon. The clean drills were then inserted into the substrate holder of FIG. 8. The vacuum chamber 1 was first evacuated to a pressure of $10^{-5}$ mbar, and then argon with a purity of 99.99% was admitted until the pressure in the vacuum chamber was $2 \times 10^{-3}$ mbar.

The axial distance between the anodes 20 and 21 amounted to 95 mm, the axial distance between the two electron emitters 18 and 19 was 60 mm. Dimension a was 85 mm, dimension b 40 mm. The distance of the plane E1 through the electron emitters 18 and 19 from the front plate was 20 mm, and of plane E1 from the pole faces of the permanent magnets 30 mm. The width of the secondary electrode 31 was about 80 mm, and its length (vertically) was about 500 mm.

The anode potential was set at +60 V and a negative potential of 500 V was applied to the substrates. The field strength of the magnetic field in the substrate area was 600 A/m, and in the electron emitter area 3500 A/m. Throughout the entire etching operation, which lasted for four minutes, a power density of 2 Watts/cm² of the substrate surface was established. The result was a perfect etch extending over the entire surface of the drills 17 and no damage was done to the cutting edges.

In a subsequent coating process the drills were coated with a system of layers 4 μm thick of $TiAlN_x$. Loading tests showed that the $TiAlN_x$ coating had no tendency to separate.

A composition of Ti:Al 50:50 at % was used as the target. The coating took place as described above with the use of nitrogen as the reactive gas.

In this apparatus with continuous rotation of the substrates (cf. also EP 0 211 057 and EP 0 371 252), for the production of several alternating layers 52, 51, it suffices to make the rotatory speed of the substrates so high that during the periods of high and low partial pressure, several passes of the substrates through the coating area in front of the material source (magnetron cathode) are necessary.

The following table shows the different properties of the coating.

| Property | TiN | One-layer system $TiAl-N_x$ | Multi-layer coating $TiAl-N_x$ |
|---|---|---|---|
| Target material | Ti | Ti/Al 50/50 | Ti/Al 50/50 |
| Stress | medium | high | low |
| Hardness/HV 0.01 | 2300 kp/mm² | 2500 kp/mm² | 2400 kp/m |
| Coeff. of friction | 0.4 | 0.6 | 0.25 |
| Resistance oxidation | 600C | 700C | 700-750C |
| Cutting performance: | | | |
| In high-strength steel | medium | low | high |
| In GG 25 | medium | high | high |

Figure 14:
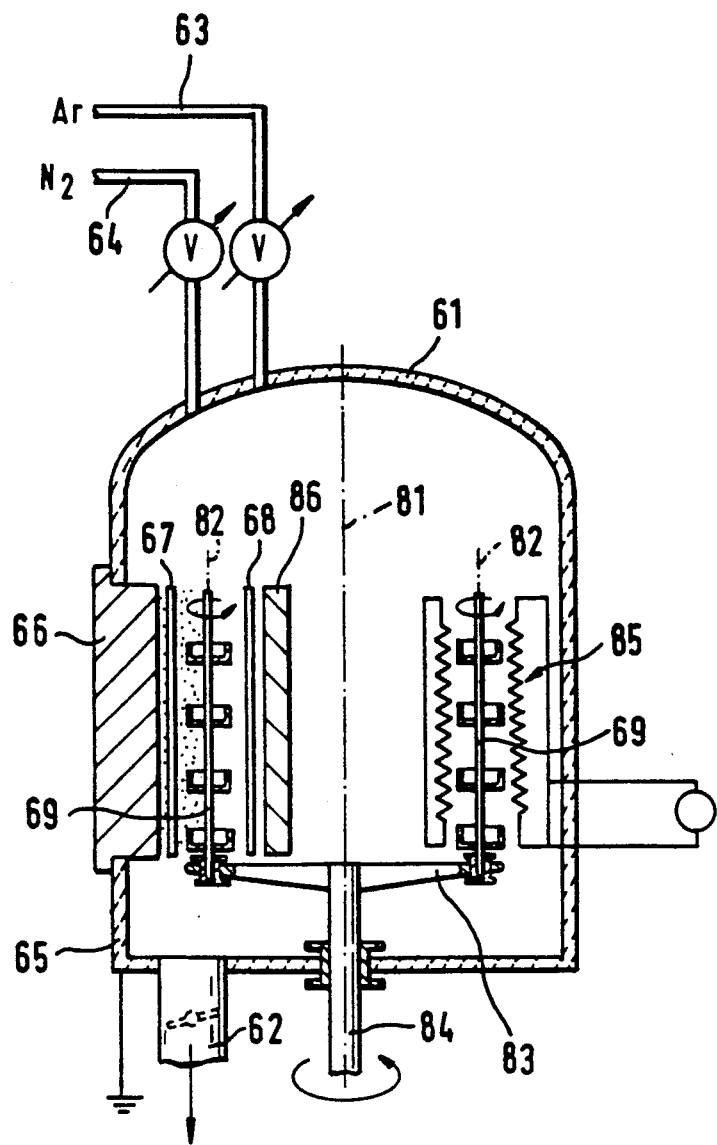
FIG. 14 is another embodiment of a complete sputtering apparatus represented diagrammatically in vertical section.

The sputtering apparatus in another embodiment (FIG. 14) has a hermetically sealed, grounded housing 61, which can be evacuated through a connection 62 near the bottom for a vacuum pump. Through the argon line 63 and the $N_2$ line 64 at the top of housing 61, an inert gas, such as argon, and/or a reaction gas, such as nitrogen, can be introduced into the housing 61. A magnetron 66 is inserted into the housing wall 65 (a so-called high-power sputtering cathode) on which a Ti/Al target containing 50 at % Al, for example, is bonded.

An ionization system with two electrodes 67 and 68 is disposed in the immediate vicinity of the magnetron 66, and between them a substrate holder 69 carrying substrates not shown can be passed on a circular path.

Of the two electrodes 67 and 68 of the ionization system, the electrode 67 closer to the magnetron is at a positive voltage, while the electrode remote from the magnetron is the emitter electrode 68. The electrodes are preferably one or two rods of a heat-resistant metal, such as tungsten for example. Behind the emitter electrode 68 (looking from the magnetron 66 toward the housing axis 81) there is disposed a magnet system 86 which produces the above-described raising of the bias current by up to 30 at %.

The substrate holders 69 are each mounted for rotation about an axis 82, so that through the rotation of the substrates a uniform and all-around coating of the substrates can take place in the area of the ionization system and magnetron. A great number of such substrate holders 69 are fastened to a horizontal substrate stack carrier 83, which is rotatable about the housing axis 81 by means of a drive shaft 84 coaxial therewith. In the area of the housing opposite the ionization system is a heating station 85 past which the substrate holders 69 are carried with the substrates as the stack carrier 83 rotates about the housing axis 81, in order to heat them before they are coated.

DESCRIPTION OF COATING PROCESS

A more or less great number of atoms or particles are knocked out of the target, especially from the areas where the horizontal components of the magnetic fields peak. A large part of the sputtered atoms leaves the target for the substrate where a thin multiple layer is deposited by the addition of nitrogen in accordance with FIG. 13. The build-up of the coating takes place step by step.

A computer not shown in the drawing can be provided to control the process by processing the acquired data and issuing commands. The data acquired by measuring the partial pressure of the reactive gas, for example, can be fed to this computer. On the basis of these and other data, it can for example control the flow of reactive gas from a tank or any other gas flow from a tank by means of valves inserted in the lines, and set the electronic operating parameters of the cathode. The computer is also able to monitor all other variables.

The coating apparatus shown in the drawing can also be operated through a microprocessor not represented in the drawing. This makes it possible to carry out a complex coating process involving a number of individual, precisely repeatable steps. The sputtering power supply is regulated, but it is also possible to operate with line regulators.

To sputter off the magnetron cathodes, baffles mounted on a rotator can be run between the cathodes and the substrates. Then the cathodes are sputtered free in two steps. The first step is a brief sputtering at low pressure and low cathode current, and in the second step the pressure and current are increased, while the sputtering current exceeds the current during the coating. The pressure is approximately equal to the coating pressure.

The sputtering-off time depends on the target material and on the coating process used.

Processes such as magnetron sputtering make coating technologies available which permit the PVD process to be performed even at relatively low substrate temperatures (200° C. to 600° C.).

In the new multi-layer coating the entire coating of the hard substance is formed by sandwiching together numerous first layers 52 and second layers 51; which likewise consist of hard substances. In this manner the inherent tension of the entire coating is reduced (FIG. 9).

In this manner, laminated materials can be produced such as cannot be obtained by conventional metallurgical fusion processes.

End products, including articles of common usage, tool materials such as tool steels, high-speed steels, sintered carbides, stellites and high-grade stainless steels are first degreased and cleaned in alkaline ultrasonic baths. Then the tools are rinsed and dried.

This mechanical and chemical cleaning is followed by ionic etching (sputter cleaning). This process takes about 1 to 10 minutes depending on the etching performance and the contamination of the substrates. The substrates are supplied with a potential of $-300$ V to $-1750$ V, and the argon pressure is around $10^{-2}$ mbar.

The quality of the coating to be deposited afterward depends on the geometric arrangement of the process, the sputtering power and the flow of reactive gas, among other things. The typical rates of deposit for TiAl—$N_x$ in DC operation, at a power density at the target of 10 W/cm$^2$ and a chamber pressure of $5 \times 10^{-3}$ mbar of argon, are around 100 nm/min. The rate of deposition decreases as the $N_2$ partial pressure increases. If the partial pressure is too high there is the danger that the target surface may become nitrided.

The substrate that is to be coated is connected, according to FIG. 1, to a potential (bias) that is negative with respect to the wall of the vessel. This brings it about that the substrate is bombarded constantly with metal ions and inert gas ions during the coating process. This particle bombardment additionally provides at the beginning of the coating process for an improved adhesion between the coating and the substrate (interface). As the process continues, this ion bombardment leads to a densification of the cover coating.

The deposit of energy-rich particles combined with the additional heating of the substrates provides for greater motility and diffusion of the deposited atoms on the substrate surface, which has a strong effect not only on the properties of the coating but also on the growth of the coating.

As for the structure, morphology and texture, it can be said that the lattice structure of TiAl—$N_x$ is approximately the same as that of the material TiN with NaCl structure, Ti atoms being replaced by the Al atoms, depending on the aluminum content.

Figure 10:
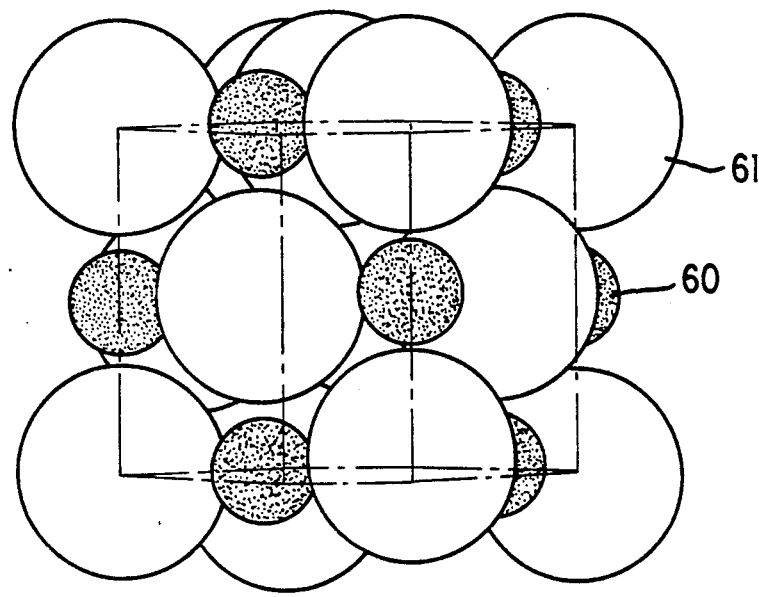
FIG. 10 shows an arrangement of atoms in the Ti—$N_x$ lattice.
Figure 11:
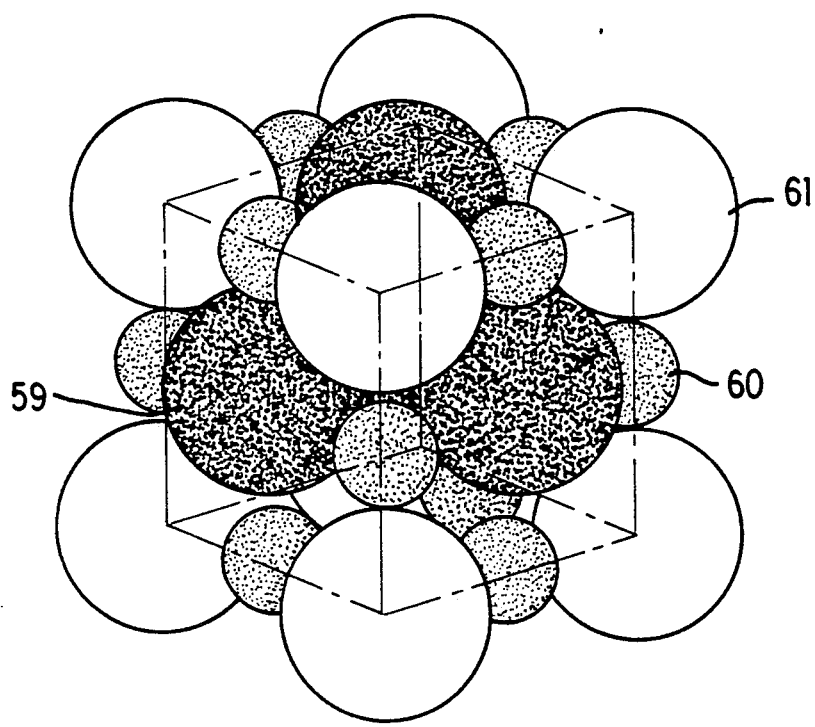
FIG. 11 shows an arrangement of atoms in TiAl—$N_x$.

In FIG. 10 the lattice structure of TiN is represented, and in FIG. 11, the lattice structure of TiAl—$N_x$, the small diameter marked 60 being nitrogen, the diameter marked 59 being aluminum, and the diameter marked 61 being titanium.

The lattice constant of 4.24 Å for the material TiN becomes smaller with increasing aluminum content due to the smaller atomic radius of aluminum in comparison to titanium and in the case of the material TiAl—$N_x$ it shrinks by about 0.07 Å. The coating structure can be influenced according to the substrate bias current density, the argon pressure and the substrate temperature. The best coating properties can be achieved by forming the structure according to Zone T in the Thornton model. This is a transition structure of tightly packed, fibrous grains. The coating surface is very smooth. The coating grows, depending on how the process is conducted, with a (111) preferential orientation or a (111, 220, 200) multiple orientation.

In the case of tools, especially cutting tools, to be able to use high-strength functional coatings of TiAl—$N_x$ which must have a comparatively great coating thickness for the thin-layer art, it is necessary for the ternary sputtered coating to have a low inherent tension, like conventional binary PVD coatings. The total tension which occurs when the coating is used on the interface coating substrate, has hitherto prevented the use and in some cases even the manufacture of thick ternary coatings which then were not functionally usable.

The new method and the new multi-layer coating made thereby bring it about that again and again a new section of growth is started by the interleaved layers, which forms independently of the previously formed layer. Due to the multiple interruption or the interleaving of thin first layers with a higher N to Ti ratio, the coating becomes overall more tension-free than conventional single-layer coatings.

These multi-layer coatings are suitable for end products, especially cutting tools, which are to have a high strength and a long useful life, especially in the critical area of sharp edges and corners. For, in practical use, the tension involved in the machining operation, especially in the case of high-strength materials, is superimposed on the tensions already present in the tool. The tensions occurring in the coating-substrate interface can therefore advantageously be reduced by putting a plurality of intermediate layers into the coating, so as to prevent the coating material or functional coatings that completely surround the tool and protect it against wear from loosening or spalling off.

The multilayer coating 72 represented in FIG. 9 can therefore completely envelop the tool or substrate 17 or all of its functional surfaces. Tools which are not so complex in manufacture are usually coated but once, while tools that are more expensive to manufacture can easily be coated again and again.

Figure 13:
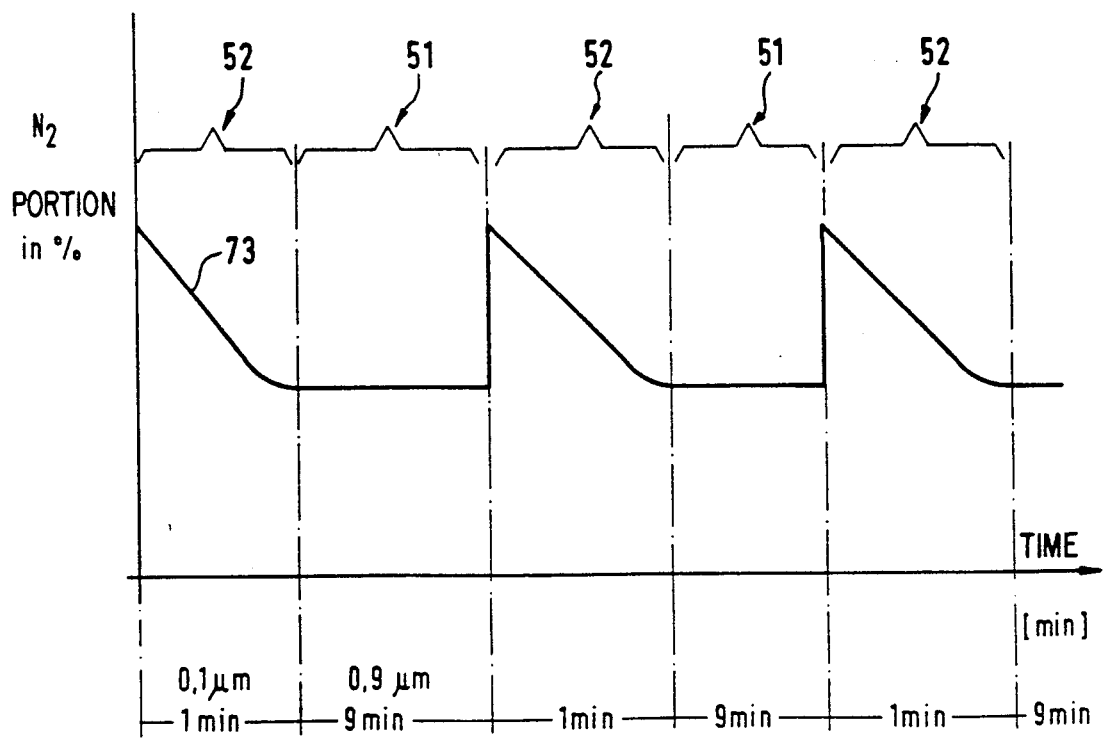
FIG. 13 represents the nitrogen input in percent during the coating process for the formation of alternating layers over the time period t in minutes.

FIG. 13 shows the passage of time during the formation of the multilayer coating on the substrate. From this can be seen how the nitrogen content is fed into the vacuum chamber over the time t in minutes. The nitrogen content in the interlayer 52 is advantageously made very high at first and thereafter the nitrogen feed is reduced according to gradient 73. The function is a gradient of the gas feed. The time curve can be seen in FIG. 13, wherein approximately 1 minute is required for the formation of first layer 52 of approximately 0.1 $\mu$m, and about 9 minutes for the formation second layer 51 of approximately 0.9 $\mu$m.

Depending on the application, first a thin first layer 52 with a thickness between 0.05 and 0.15 $\mu$m is formed, in which the nitrogen content is relatively high. (Compare with the curve in the first section of FIG. 13, layer 52.) The relatively thin layer 52 functions as a glue in the coating system, enabling a second, thick coating 51 full of tensions and containing less nitrogen to be applied onto the first layer 52.

In reactive sputtering, on account of the target chemistry present at the cathode, the sputtering rate is lowered, causing aluminum to concentrate briefly in the substrate at an increased nitrogen feed, because the titanium reacts preferentially with the increasing nitrogen content in the apparatus. Due to the change in the ratio Ti:Al:N, an effect on the growth first layer 52 is achieved. The described variation of the concentration ratio Ti:Al must then again be modified so that the Ti:Al ratio will remain approximately the same (cf. layer 51).

Figure 12:
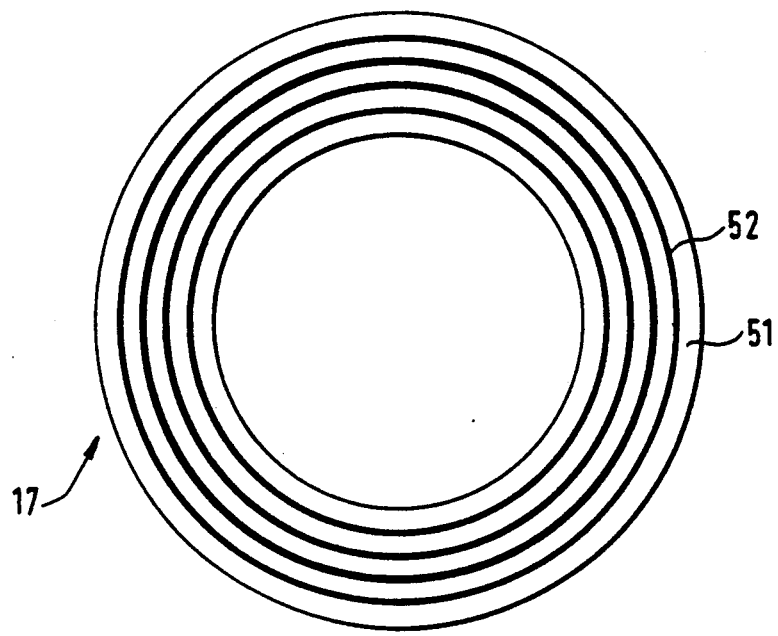
FIG. 12 is a representation of a polished cup after performance of a Calotest (6 μm) in a thick multilayer coating of TiAl—$N_x$ hard material, therein the dark rings represent the hard intermediate first layers and the light rings the material composition of lower nitrogen content (second layers)

The entire coating 72 can consist of a total of six individual layers 51 and 52, a first layer 52 being followed each time by a thick second layer 51. The layered structure can be seen in FIGS. 9 and 12 which represent a Calotest. A coating of this kind or a functional build-up coating 72 for tools or high-speed steels, respectively, can have a thickness of approximately 3.5 $\mu$m and more.

The thicker second layer 51 can have a thickness between 0.5 and 1.5 $\mu$m. The thicker layer offers lower friction on account of its lower nitrogen content in comparison to the first layer 52. The thicker second layer is for this reason substantially more desirable on the tool because the chips slide more easily on it.

On account of the structure of layer 72 in accordance with the invention it is possible for the first time to apply TiAl—$N_x$ in a thick functional coating on a heavy-duty tool without the need to fear that it will break off, since this coating contains little or no tensions in comparison to a coating made This is brought about advantageously by providing a layer 52 that is richer in nitrogen between two thick low-nitrogen layers 51.

The second layer 51 of TiAl—$N_x$ usually avoids the propagation of growth defects which occurs in the continuously progressing formation of layers, since the growth of the layer that is building up is interrupted after certain time intervals (according to FIG. 13) by the second, thinner first layer 52 that is richer in nitrogen. This also avoids the influence of the continuation of growth defects in the layer as the thickness increases.

The better resistance to oxidation of TiAl—$N_x$ in comparison to TiN can be explained by the formation of $Al_2O_3$ and the selective oxidation of aluminum at the substrate surface. Aluminum diffuses out of the TiAl—$N_x$ layer into the marginal zone and the surface is oxidized by the oxygen from the ambient atmosphere.

The input of aluminum causes an improvement in oxidation resistance in the TiN system. The oxide skin that forms on the surface of the coating in the process of wearing acts as a layer blocking further diffusion processes. Diffusion-induced wearing processes can be reduced thereby. In addition, the $Al_2O_3$ coating forming on the surface has a high mechanical stability which acts to reduce wear.

Studies have shown that after oxidation aluminum and oxygen are found almost exclusively in the marginal part of the TiAl—$N_x$ layer. Titanium and nitrogen have vanished almost completely in the outer oxidation zone. In general it can be found that the TiAl—$N_x$ has an improved oxidation resistance (TiN 600° C., TiAl—$N_x$ 700°-750° C.) in comparison to TiN and has outstanding wearing properties, for example on rotatable tool inserts, drills or wire drawing dies and turbine buckets.

In the deposition of hard metal layers, what is desired as a rule is a growth that is as tight as possible, corresponding to area T of the Thornton diagram. Even in the case of optimum layer growth, edges and tips on tools and components cause a disturbance of the uniform layer growth in microscopically small areas.

This effect is to be observed especially where an orientation mainly prevails in the top layers of two surfaces in contact. In transitional areas such as cutting edges and knife edges, growth defects actually occur to a greater extent.

Taking the coating of a drill as an example, it can be shown that especially the areas of the main and secondary cutting edges and the area of the corners of cutting edges are problematical as regards layer growth.

An uninterrupted growth with a preferential orientation causes "growth transitions" at all cutting edges and corners of cutting edges, because a corresponding number of coated surfaces meet one another in these areas.

At these transitions, break-up and wear of the coating will rapidly occur in use in the presence of mechanical stress on the tool. An early failure of the hard layer and premature failure of the tool are the consequence.

The multi-layer TiAl—$N_x$ coatings form an alternative to this. The specialty of these coatings lies in the controlled interruption of the homogeneous growth of the coating. As a result, such problem areas, as described in connection with the drill, for example, do not occur in the edge areas of coated tools in the pronounced and therefore critical manner described. Moreover, the inherent tensions of the entire hard coating are considerably reduced by this coating method.

In comparison with one-layer coatings of TiN and TiAl—$N_x$, dense wear-resistant coatings can be produced with the newly developed multi-layer coating, which is preferably executed with a plurality of preferential orientations (textures), and their thicknesses are four to six times those of conventional coatings.

The critical load, as a measure of the adhesion of the hard coating, is tested by scratching the surface coating with a conical diamond. The term, "critical load value," is understood to mean the weight of pressure at which the coating separates from the substrate.

The critical load values for a multi-layer TiAl—$N_x$ hard coating on polished steel substrates of HSS (S6-5-2) are between 45N and 90N.

The coefficient of friction was measured with a stylus-and-disk tester. The friction coefficient for TiN as a disk coating and 100 Cr 6 as the ball material is about 0.44, and that for TiAl—$N_x$ with the same ball material is about 0.58. The friction coefficient of the newly developed coating for 100 Cr6 is 0.25.

The material pair HSS/100 Cr 6 has a friction coefficient of 0.73.

If a high-speed steel is used as the ball material, the friction coefficient for the combination with TiAl—$N_x$ is lower by a factor of 2.2, and for the combination with the TiAl—$N_x$ or TiN hard coatings it can be reduced to about 40%.

Drilling tests were performed both with TiN-coated and TiAl—$N_x$-coated drills. The materials to be drilled were X 10 CrNiMoTi 18 10 and 42 CrMo 4, respectively. The drills were made from high-speed steel (S6-5-2).

Drills with diameters of 5 mm and 10 mm were used for the drilling tests.

In the case of the TiN-coated drills, at the same mechanical loading, the cutting speeds and feeds could be twice as high as with uncoated drills.

It is furthermore advantageous that the carbon content increases toward the surface in the upper and/or last second coatings 51.

In the final coating 51 the carbon content can amount to 50 at % with respect to Ti.

It is furthermore possible for at least one of the coatings to have an alloy component of 35 at % Ti, 35 at % Al and 30 at % N.

It is also possible to form the final thick layer or top layer for protection against wear from another composition of material to serve as a very hard top layer, this material being one of the composition $Mo_2B_5$, $W_2B_5$, $MoB_2$, $NbB_2$, $VB_2$, $CrB_2$, $HfB_2$, $TaB_2$, $ZrB_2$, $TiB_2$, $B_4C$, BN, $Al_2O_3$, $ZrO_2$, $HfO_2$. This coating is appropriate especially where great hardness and wear resistance is required.

We claim:

1. A hard multilayer surface coating for a substrate comprising
    a plurality of first layers wherein each first layer consists of at least one element from a first group consisting of Ti, Zr, Hf, and V, at least one element from a second group consisting of Al and Si, and at least one element from a third group consisting of N and C, the content of said at least one element from said third group varying from a maximum to a minimum through the thickness of each first layer, and
    a plurality of second layers alternating with said first layers, each said second layer consisting of at least one element from each of said first, second, and third groups, the relative proportion of said at least one element from said third group being less in said second layer than in said first layer.

2. A surface coating as in claim 1 wherein said second layer consists of Ti, Al, and N.

3. A surface coating as in claim 1 wherein said second layers are thicker than said first layers.

4. A surface coating as in claim 3 wherein said first layers have a thickness of 0.05 to 0.15 μm and said second layers having a thickness of 0.5 to 1.5 μm.

5. A surface coating as in claim 1 wherein at least some of said plurality of second layers contain carbon.

6. A surface coating as in claim 5 wherein said coating is applied to a surface being coated and extends to a surface of the coating, and said at least some of said plurality of second layers have a carbon content which increases toward said surface of said coating.

7. A surface coating as in claim 6 wherein said second layer at said surface of said coating contains titanium and has a carbon content of 50 at % with respect to said titanium.

8. A surface coating as in claim 1 wherein said first layer consists of Ti, Al, and N.

9. A surface coating as in claim 8 wherein said nitrogen content in each first layer decreases from a maximum to a minimum with a continuous gradient through the thickness of said each first layer.

10. A surface coating as in claim 8 wherein the ratio of atoms Ti:N in the first layer varies in the range of 0.9 to 1.1.

11. A surface coating as in claim 10 wherein the ratio of atoms Ti:N in the first layer varies in the range of 0.95 to 1.0.

12. A surface coating as in claim 8 wherein said second layer consists of Ti, Al, and N.

13. A surface coating as in claim 12 wherein the ratio of atoms Ti:Al in at least one of said layers varies in the range of 0.8 to 1.0.

14. A surface coating as in claim 12 wherein at least one second layer has an elemental composition of $Ti_{0.34}Al_{0.37}N_{0.29}$.

15. A surface coating as in claim 12 wherein the ratio of atoms Ti:N in the second layer is in the range of 1:3 to 1.1.

16. A surface coating as in claim 15 wherein the ratio of atoms Ti:N in the second layer is in the range of 1.15 to 1.2.

* * * * *